(12) United States Patent
Yasui

(10) Patent No.: US 11,464,145 B2
(45) Date of Patent: Oct. 4, 2022

(54) MOUNTING SYSTEM, MOBILE WORK DEVICE, AND MOBILE WORK MANAGEMENT METHOD

(71) Applicant: FUJI CORPORATION, Chiryu (JP)

(72) Inventor: Yoshihiro Yasui, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/266,886

(22) PCT Filed: Aug. 23, 2018

(86) PCT No.: PCT/JP2018/031145
§ 371 (c)(1),
(2) Date: Feb. 8, 2021

(87) PCT Pub. No.: WO2020/039543
PCT Pub. Date: Feb. 27, 2020

(65) Prior Publication Data
US 2021/0315139 A1 Oct. 7, 2021

(51) Int. Cl.
*B23P 19/00* (2006.01)
*H05K 13/04* (2006.01)
*H05K 13/02* (2006.01)

(52) U.S. Cl.
CPC .................... *H05K 13/021* (2013.01)

(58) Field of Classification Search
CPC ............ H05K 13/021; H05K 13/0495; H05K 13/0882; H05K 13/0888
See application file for complete search history.

(56) References Cited

U.S. PATENT DOCUMENTS 9,545,045 B2 * 1/2017 Yamauchi .......... H05K 13/0061
2021/0307224 A1 * 9/2021 Yasui ................... H05K 13/086
(Continued)

FOREIGN PATENT DOCUMENTS

| JP | 2005-235952 A | 9/2005 |
| WO | WO 2016/013107 A1 | 1/2016 |
| WO | WO 2018/008148 A1 | 1/2018 |

OTHER PUBLICATIONS

International Search Report dated Nov. 6, 2018 in PCT/JP2018/031145 filed on Aug. 23, 2018, 2 pages.

*Primary Examiner* — Paul D Kim
(74) *Attorney, Agent, or Firm* — Oblon, McClelland, Maier & Neustadt, L.L.P.

(57) ABSTRACT

A mounting control section of a mounting device causes a mounting section to pick up a component from a feeder at a position designated in mounting condition information. When component depletion of the feeder for which component depletion is predicted occurs, the mounting control section executes a spare component pickup process in which the mounting section is caused to pick up the component from the exchange feeder loaded to the spare loading section at a position not designated in the mounting condition information. Then, when component depletion of the feeder for which component depletion is predicted occurs, the moving control section collects the component depleted feeder in the accommodation section while moving and loading the exchange feeder, on which the spare component pickup process corresponding to the collected component depleted feeder is being performed, to the loading section from which the component depleted feeder was collected.

13 Claims, 7 Drawing Sheets

(56) References Cited

U.S. PATENT DOCUMENTS

2021/0315138 A1\* 10/2021 Yasui .................. H05K 13/086
2021/0315140 A1\* 10/2021 Yasui ................. H05K 13/0417

\* cited by examiner

Fig. 7
Fig. 7A
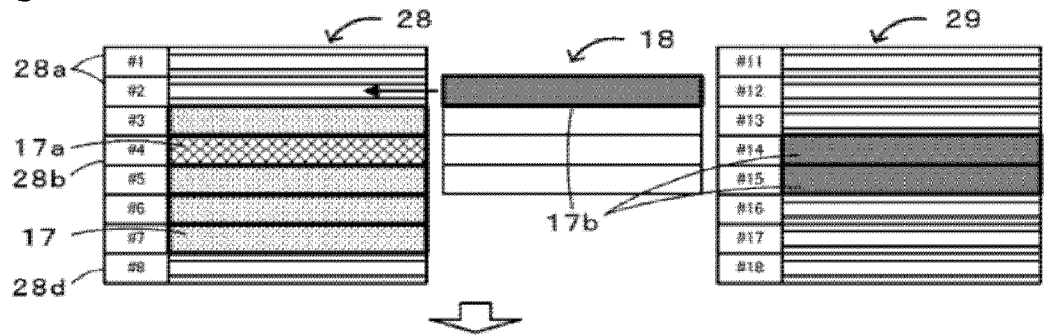
Fig. 7B
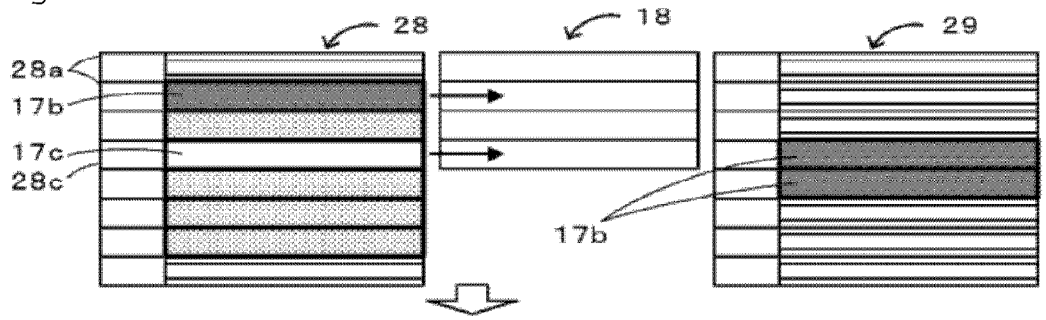
Fig. 7C
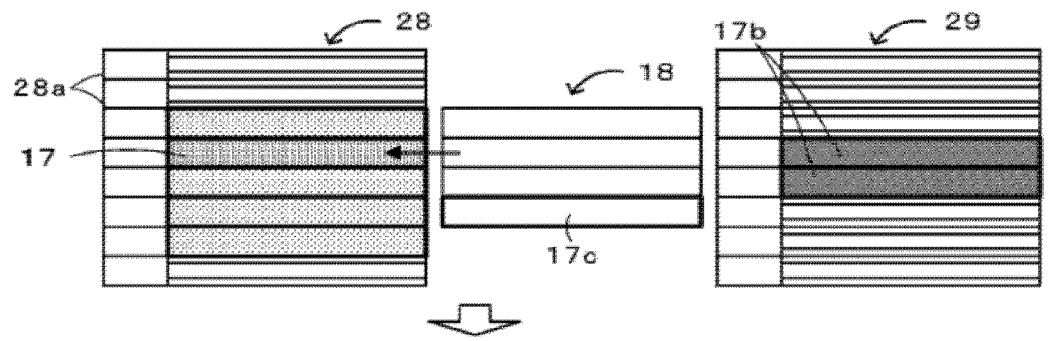
Fig. 7D
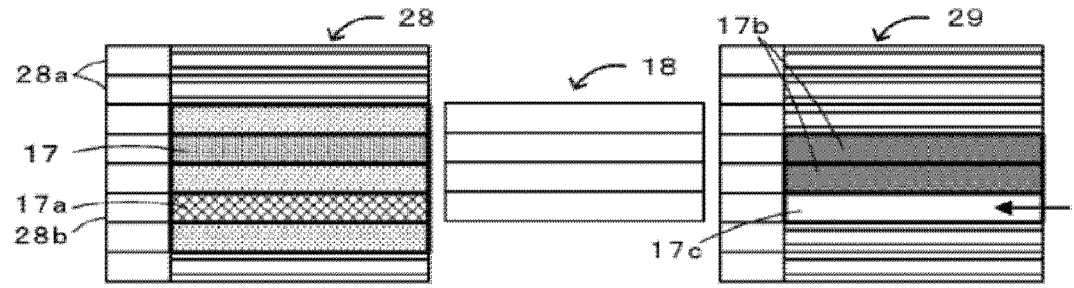

MOUNTING SYSTEM, MOBILE WORK DEVICE, AND MOBILE WORK MANAGEMENT METHOD

TECHNICAL FIELD

The present specification discloses a mounting system, a moving work device, and a moving work management method.

BACKGROUND ART

Conventionally, there has been proposed a mounting device having a set area in which a component can be picked up from a feeder and a stock area in which a component cannot be picked up from a feeder, wherein a feeder in which components remain is temporarily retracted to the stock area, and a feeder standing by in the stock area is moved to the set area (see, for example, Patent Document 1). In this mounting device, it is possible to prevent multiple feeder depletions from occurring at the same time, making it possible to suppress stopping the operation of the mounting device when exchanging feeders. Further, a mounting device has been proposed that loads a feeder of a component type for which component depletion occurs most quickly to a shared spare unit holding section and switches to pick up a component from the feeder of the shared spare unit holding section when component depletion of a feeder occurs (see, for example, Patent Document 2). In this mounting device, it is possible to further suppress stopping the mounting device due to component depletion.

PATENT LITERATURE

Patent Document 1: International Publication No. 2016/013107
Patent Document 2: Japanese Patent Publication No. 2005-235952

BRIEF SUMMARY

Technical Problem

However, in the mounting device described in Patent Document 1, although it is possible to prevent multiple feeder depletions from occurring at the same time and thereby suppress stopping the operation of the mounting device when exchanging feeders, it is still insufficient, and thus there is a need for further improvement. In addition, in the mounting device of Patent Document 2, although the mounting process is sustained by switching so that components are picked up from the feeder of the shared spare unit holding section, if this process is continued, the efficiency of the mounting process may be reduced due to the increased amount of time to pick up components from a position different from the original position.

It is a principal object of the present disclosure to provide a mounting system, a moving work device, and a moving work management method capable of efficiently executing the mounting process.

The present disclosure has taken the following means to achieve the main object described above.

The mounting system of the present disclosure comprises a mounting device provided with a supply section configured to load a feeder, including a holding member for holding components, to one or more loading sections, a mounting section configured to mount components supplied from the supply section, and a mounting control section configured to control the mounting section; and a moving work device provided with an accommodation section configured to accommodate feeders, and a moving control section configured to move the feeders to collect the feeders from the supply section and/or load the feeders to the supply section; wherein the mounting control section causes the mounting section to pick up a component from a feeder at a position designated in mounting condition information; the moving control section, when component depletion of a feeder loaded to the loading section is predicted, moves an exchange feeder holding the component for which the component depletion is predicted and loads the exchange feeder to a spare loading section from which components can be picked up by the mounting section; the mounting control section executes a spare component pickup process for causing the mounting section to pick up the component from the exchange feeder loaded to the spare loading section at a position not designated in the mounting condition information when component depletion occurs for the feeder for which component depletion is predicted; and the moving control section collects the component depleted feeder in the accommodation section when component depletion occurs for the feeder in which component depletion is predicted, and moves and loads the exchange feeder, on which the spare component pickup process corresponding to the collected component depleted feeder is being performed, to the loading section from which the component depleted feeder was collected.

In this mounting system, the mounting device causes the mounting section to pick up components from the feeder at a position designated in the mounting condition information. Next, when a component depletion of a feeder loaded to a loading section is predicted, the exchange feeder holding the component predicted to be depleted is moved and the exchange feeder is loaded to a spare loading section from which components can be picked up by a mounting section. Subsequently, when a component depletion of a feeder for which a component depletion was predicted occurs, the mounting device executes a spare component pickup process in which the mounting section is caused to pick up a component from an exchange feeder loaded to a spare loading section at a position not designated in the mounting condition information. Then, when component depletion of the feeder for which component depletion was predicted occurs, the moving work device collects the component depleted feeder in the accommodation section while moving and loading the exchange feeder, on which the spare component pickup process corresponding to the collected component depleted feeder is performed, to the loading section from which the component depleted feeder was collected. In this mounting system, when component depletion is predicted, the exchange feeder is loaded to the spare loading section, the mounting process is continued by the spare component pickup process, whereas when component depletion occurs, the exchange feeder performing the spare component pickup process is moved to the proper position. In this mounting system, by moving the exchange feeder to the proper position, it is possible to shorten the time period for the spare component pickup process as much as possible. In addition, even in a case where component depletion occurs in another feeder when the moving work device is exchanging the exchange feeder, it is possible to prevent stopping of the mounting process by executing the spare component pickup process. In addition, by repeating such processes, as a result, it is possible to suppress stopping of the mounting process caused by frequent occurrences of component depleted feeders. As described above, in this mounting system, it is possible to efficiently execute the mounting process.

BRIEF DESCRIPTION OF DRAWINGS

FIG. 7 is a diagram showing an example of feeder 17 being moved.

DESCRIPTION OF EMBODIMENTS

Figure 1:
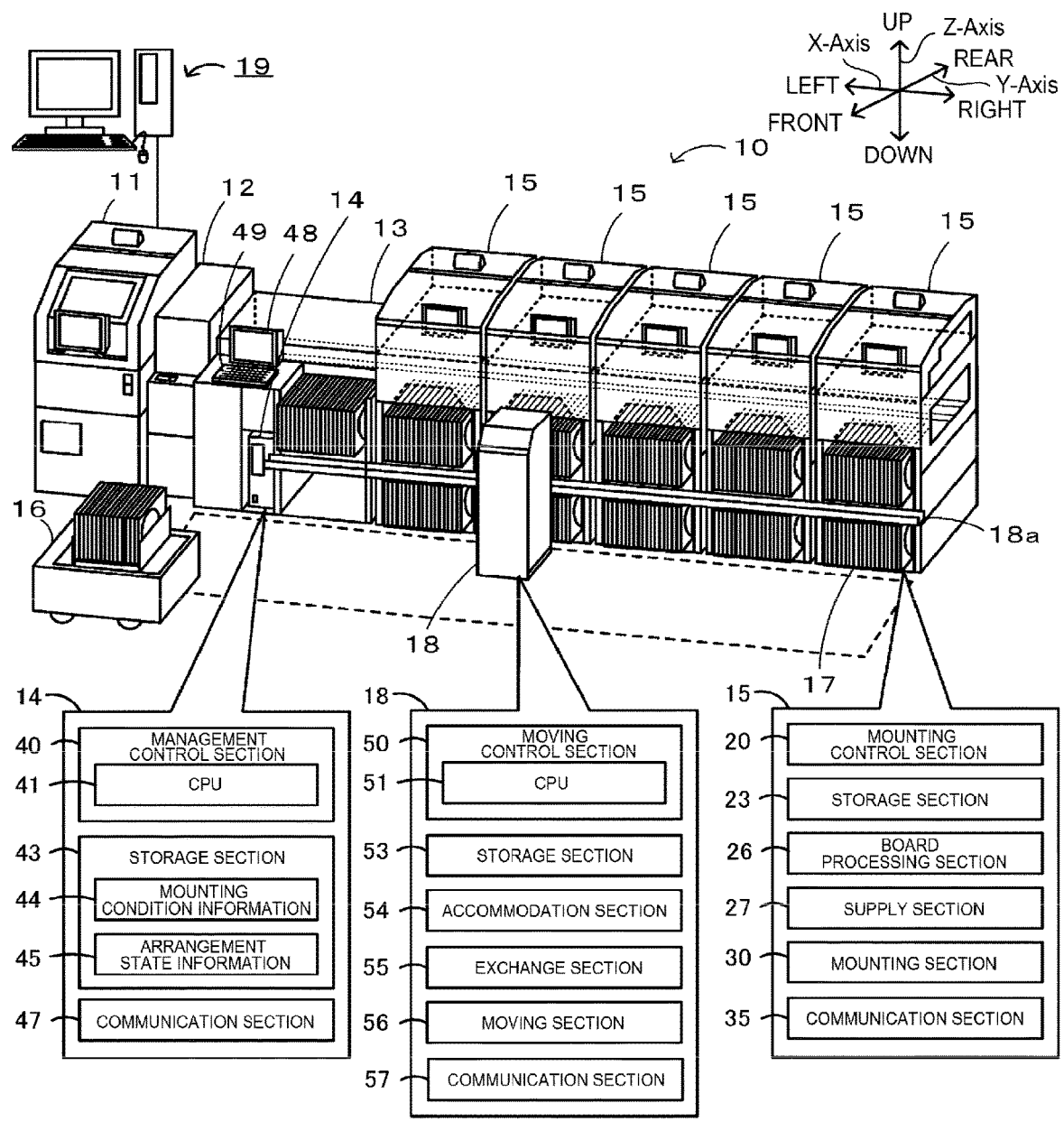
FIG. 1 is a schematic diagram showing an example of mounting system 10.
Figure 2:
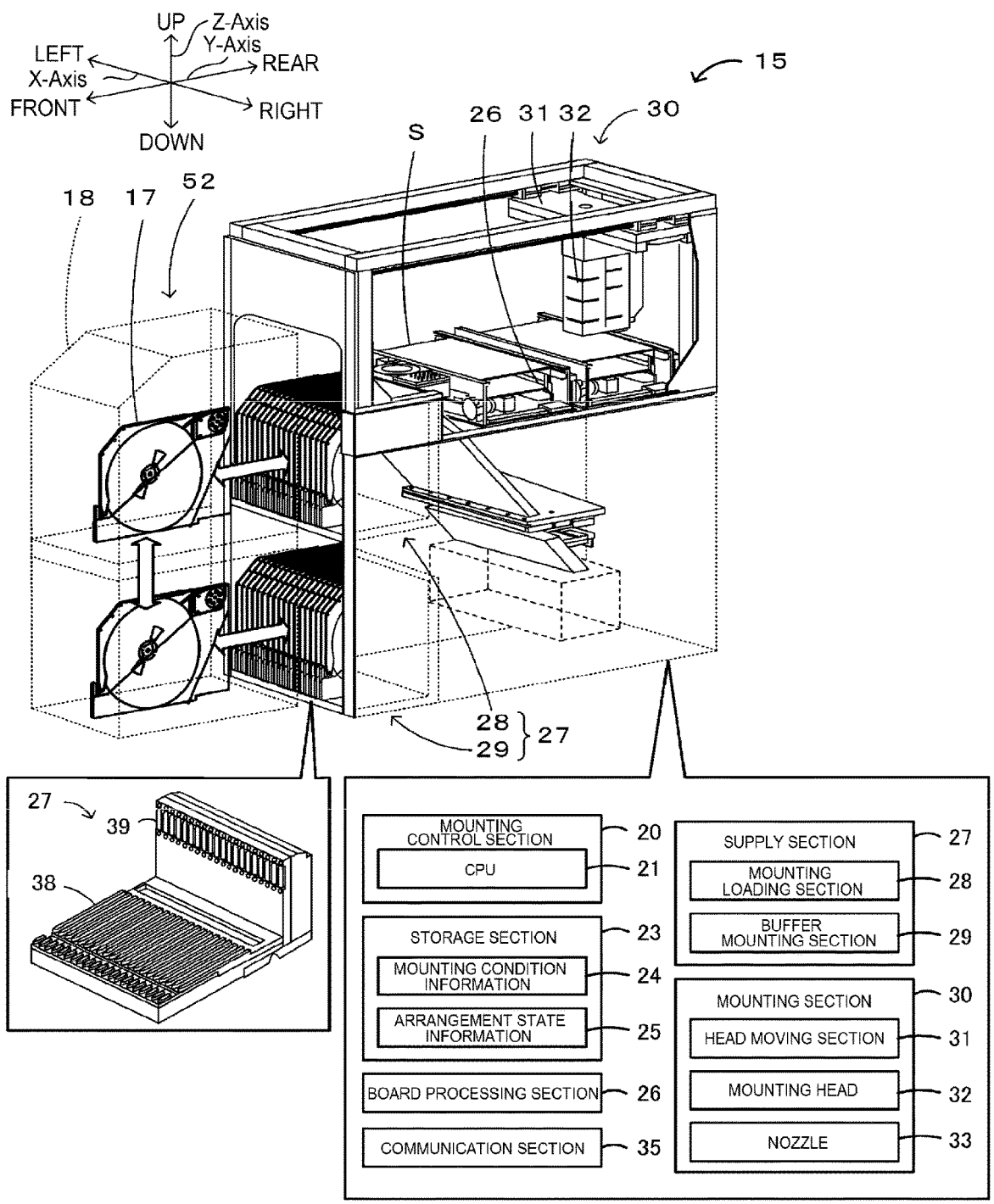
FIG. 2 is a diagram schematically showing a configuration of mounting device 15 and loader 18.
Figure 3:
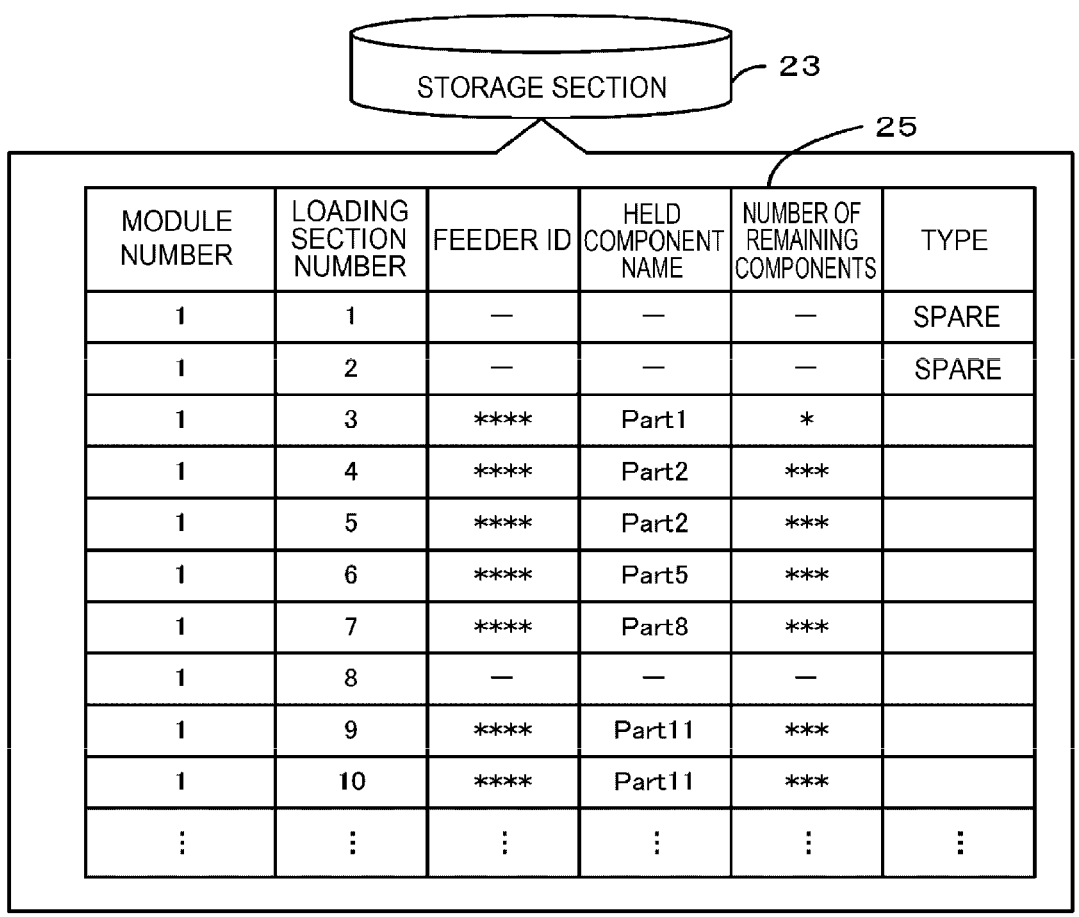
FIG. 3 is a diagram showing an example of arrangement state information 25 stored in storage section 23.

The present embodiment will be described below with reference to the drawings. FIG. 1 is a schematic diagram showing an example of mounting system 10 of the present disclosure. FIG. 2 is a diagram schematically showing a configuration of mounting device 15 and loader 18 which is a moving work device. FIG. 3 is a diagram showing an example of arrangement state information 25 stored in storage section 23 of mounting device 15. In the present embodiment, the left-right direction (X-axis), the front-rear direction (Y-axis), and the up-down direction (Z-axis) are as shown in FIGS. 1 and 2.

Mounting system 10 is configured, for example, as a production line in which devices are arranged in the conveyance direction of board S, the devices being devices for performing processes to mount components on board S which is a mounting target. Here, the mounting target is described as board S, but the present disclosure is not particularly limited to this as long as the object is an object on which components are mounted and may be a substrate having a three-dimensional shape. As shown in FIG. 1, mounting system 10 includes printing device 11, print inspection device 12, feeder storage section 13, management PC 14, mounting device 15, automatic conveyance vehicle 16, loader 18, host PC 19, and the like. Printing device 11 is a device for printing solder paste or the like on board S. Print inspection device 12 is a device for inspecting the state of the printed solder. Feeder storage section 13 is a storage location for storing feeder 17 used in mounting device 15. Feeder storage section 13 is provided below the conveyance device between print inspection device 12 and mounting device 15.

Mounting device 15 is a device for picking up components and mounting components on board S. Mounting device 15 includes mounting control section 20, storage section 23, board processing section 26, supply section 27, mounting section 30, and communication section 35. As shown in FIG. 2, mounting control section 20 is configured as a microprocessor centered on CPU 21 and controls the entire device. Mounting control section 20 outputs control signals to board processing section 26, supply section 27, and mounting section 30, and receives signals from board processing section 26, supply section 27, and mounting section 30. Storage section 23 stores mounting condition information 24, arrangement state information 25, and the like. Mounting condition information 24 is a production job and includes information such as information on components, the arrangement order in which components are mounted on board S, arrangement positions, and loading positions of feeders 17 from which components are picked up. Mounting condition information 24 is created by host PC 19 with an order and arrangement in which the mounting efficiency is high, transmitted from host PC 19, and stored in storage section 23. Mounting condition information 24 is created by securing one or more spare loading sections (also referred to as spare loading section 28a), described later in detail, among mounting loading sections 28 of supply section 27. Arrangement state information 25 is information including the type and the usage state of feeder 17 (component type, remaining number of components, etc.) that is currently installed in supply section 27 of mounting device 15. Arrangement state information 25 includes the module number of supply section 27, the loading section number indicating the position of the loading section, the ID of feeder 17 loaded to the loading section, the name of the component held by feeder 17, the number of remaining components, and the like. Arrangement state information 25 may include information of spare loading section 28a. Arrangement state information 25 is appropriately updated with current information when feeder 17 is loaded or unloaded. Communication section 35 is an interface for exchanging information with external devices such as management PC 14 and host PC 19.

Board processing device 26 is a unit for conveying in, transporting, securing and unloading board S at a mounting position. Board processing device 26 has a pair of conveyor belts extending in the left-right direction and spaced apart from each other in the front-rear direction in FIG. 1. Board S is conveyed by the conveyor belts.

Supply section 27 is a unit for supplying components to mounting section 30. Supply section 27 loads feeders 17 to one or more loading sections, each feeder 17 having a reel around which a tape serving as a holding member for holding components is wound. As shown in FIG. 2, supply section 27 has two upper and lower loading sections to which feeder 17 can be loaded in the front direction. The upper stage is mounting loading section 28 from which a component can be extracted by mounting section 30, and the lower stage is buffer loading section 29 from which a component cannot be extracted by mounting section 30. Here, mounting loading section 28 and buffer loading section 29 are collectively referred to as the loading section. The loading sections may be managed in module units grouping a predetermined number (e.g., 4 or 12) of feeders 17. Supply section 27 has multiple slots 38, arranged in the X-direction at predetermined intervals so that rail members of feeders 17 are inserted, and connecting portions 39 into which connectors provided at the distal ends of feeders 17 are inserted. Each feeder 17 includes a controller (not shown). The controller stores information such as tape IDs and component types included in feeder 17 and the remaining number of components. When feeder 17 is connected to connecting portion 39, the controller transmits information of feeder 17 to mounting control section 20.

Mounting section 30 is a unit for picking up components from supply section 27 and arranges the components on board S fixed to board processing section 26. Mounting section 30 includes head moving section 31, mounting head 32, and nozzle 33. Head moving section 31 includes a slider guided by guide rails and moved in the XY-direction, and a motor for driving the slider. Mounting head 32 is configured to pick up one or more components and be moved in the XY-direction by head moving section 31. Mounting head 32 is attached to the slider in a detachable manner. One or more nozzles 33 are attached to the lower face of mounting head 32 in a detachable manner. Nozzle 33 is configured to pick up components by use of negative pressure. Aside from nozzle 33, the pickup member for picking up components may be a mechanical chuck or the like that mechanically holds components. Management PC 14 is a device for managing feeder 17 and is a moving work management device for generating execution data executed by loader 18. Management PC 14 includes management control section 40, storage section 43, communication section 47, display section 48, and input device 49. Management control section 40 is configured as a microprocessor centered on CPU 41 and controls the entire device. Storage section 43 is a device such as an HDD for storing various data such as a processing program. As shown in FIG. 1, storage section 43 stores mounting condition information 44, arrangement state information 45, and the like. Mounting condition information 44 is the same data as mounting condition information 24 and is acquired from host PC 19 or the like. Arrangement state information 45 is the same data as arrangement state information 25 and is acquired from mounting device 15. Communication section 47 is an interface for exchanging information with external devices such as mounting device 15 and host PC 19. Display section 48 is a liquid crystal display for displaying various information. Input device 49 includes a keyboard, a mouse, and the like through which an operator inputs various commands.

Automatic conveyance vehicle 16 is configured to automatically convey feeder 17, a member used in mounting system 10, and the like between a storage chamber (not shown) and feeder storage section 13.

Loader 18 is a moving work device and is a device that moves within a moving area at the front face of mounting system 10 (see dashed lines in FIG. 1) and automatically collects and replenishes feeders 17 of mounting device 15. Loader 18 includes moving control section 50, storage section 53, accommodation section 54, exchange section 55, moving section 56, and communication section 57. Moving control section 50 is configured as a microprocessor centered on CPU 51 and controls the entire device. Storage section 53 is an HDD or the like for storing various data such as processing programs and stores arrangement execution information 45. Accommodation section 54 has an accommodation space for accommodating feeders 17. Accommodation section 54 is configured to accommodate, for example, four feeders 17. Exchange section 55 is a mechanism for moving feeder 17 in and out as well between the upper and lower levels (see FIG. 2). Exchange section 55 has a clamp for clamping feeder 17, a Y-axis slider for moving the clamp in the Y-axis direction (front-rear direction), and a Z-axis slider for moving the clamp in the Z-axis direction (up-down direction). Exchange section 55 loads and unloads feeder 17 at mounting loading section 28 and loads and unloads feeder 17 at buffer loading section 29. Moving section 56 is a mechanism for moving loader 18 in the X-axis direction (the left-right direction) along X-axis rail 18a disposed on the front face of mounting device 15. Communication section 57 is an interface for exchanging information with external devices such as management PC 14 and mounting device 15. Loader 18 outputs the current position and the contents of the executed operation to management PC 14.

Host PC 19 (see FIG. 1) is configured as a server for managing information of each device in mounting system 10. Host PC 19 includes a control section for controlling the entire device, a storage section for storing various information, and a communication section for performing bidirectional communication with external devices such as mounting system 10, automatic conveyance vehicle 16, and loader 18. Host PC 19 acquires and manages information of mounting system 10 in addition to creating and managing condition information used in the mounting of components.

Figure 4:
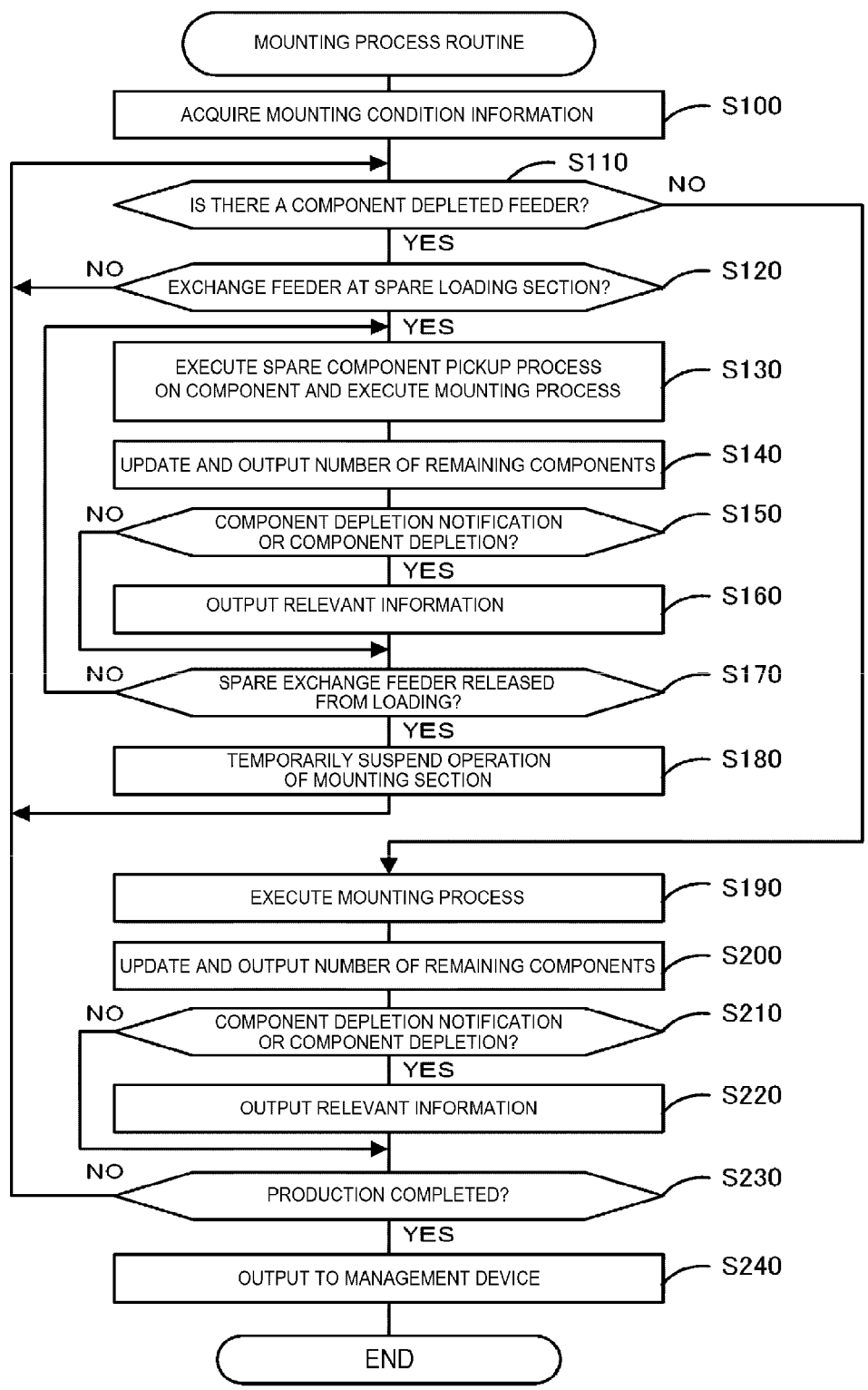
FIG. 4 is a flowchart showing an example of a mounting process routine.

Next, among the operations of mounting system 10 of the present embodiment configured as described above, the process by which mounting device 15 mounts a component on board S will be described first. FIG. 4 is a flowchart showing an example of a mounting process routine executed by CPU 21 included in mounting control section 20 of mounting device 15. This routine is stored in storage section 23 of mounting device 15 and executed in accordance with a start instruction from an operator. When this routine is started, CPU 21 first acquires the mounting condition information of board S to be manufactured at this time (S100). CPU 21 acquires the mounting condition information from host PC 19. Next, CPU 21 determines whether there is feeder 17 that is depleted of components (also called component depleted feeder 17c (see FIG. 7)) (S110). For example, immediately after mounting has started, it is determined that there is no component depleted feeder 17c. If there is no component depleted feeder 17c (NO in S190), CPU 21 executes a mounting process. In the mounting process, CPU 21 causes mounting head 32 to pick up a component from feeder 17 at a predetermined position based on mounting condition information 24 and moves the component to an arrangement position of board S.

Next, CPU 21 updates the number of remaining components of the used component and outputs the updated number to host PC 19 and management PC 14 (S200). Next, CPU 21 determines whether there is feeder 17 for which the number of remaining components has reached a predetermined number of advance notifications for which advance notifications of component depletion should be made, and whether there is feeder 17 for which the number of remaining components has reached component depletion (S210). If an affirmative decision is made in S210, CPU 21 outputs the relevant information (S220). Specifically, when there is feeder 17 whose number of remaining components has reached a predetermined number of advance notifications, CPU 21 outputs an advance notification of component depletion of the corresponding feeder 17 to management PC 14. The component depletion notification is included in the prediction of the component depletion and is information for notifying that there is feeder 17 that will soon reach component depletion. The advance notification of component depletion can be determined, for example, when the number of remaining components becomes less than or equal to a predetermined advance notification number, or when the time until component depletion, calculated from the number of remaining components and the number of components consumed per unit time, reaches a predetermined time period or the like. In addition, when there is feeder 17 for which the remaining number of components reaches the component depletion state, CPU 21 outputs the occurrence of the component depletion state of the corresponding feeder 17 to management PC 14. After S220, or when there is no notification of component depletion or component depletion has not occurred in S210, CPU 21 determines whether the production of board S is completed (S230). If production is not completed, CPU 21 executes the processes of S110 and subsequent steps.

On the other hand, when there is a component depleted feeder 17c in S110, it is determined whether exchange feeder 17b is loaded to a spare loading section (spare loading section 28a) that is a position not designated in mounting condition information 24 (S120). Here, exchange feeder 17b refers to feeder 17 to be used next having a tape that holds the same components as component depleted feeder 17c. Spare loading section 28a refers to a loading section secured in advance for loading exchange feeder 17b among mounting loading sections 28 from which mounting section 30 can pick up components. Spare loading section 28a may be secured by being set to be an available loading section at all times in the mounting process in the mounting condition information 24 set by host PC 19. Although at least one spare loading section 28a is secured, it may be set empirically as a number so as not to degrade the efficiency of the mounting process from the total number of loading sections and the number of feeders 17 to be loaded. When exchange feeder 17b is present in spare loading section 28a in S120, CPU 21 executes a spare component pickup process for picking up components from exchange feeder 17b loaded to spare loading section 28a for the corresponding component and executes the normal mounting process for the other components (S130).

Next, CPU 21 updates the number of remaining components of the used component and outputs the updated number to host PC 19 and management PC 14 (S140). Subsequently, CPU 21 determines whether there is a component depletion notification and feeder 17 on which component depletion has occurred, similarly to the process in S210 (S150). When it is determined that there is a component depletion notification and feeder 17 for which component depletion has occurred, CPU 21 outputs the relevant information to management PC 14 in the same manner as the process in S220 (S160). After S160 or after it is determined in S150 that there are no component depletion notifications and no feeders 17 for which component depletion has occurred, CPU 21 determines whether exchange feeder 17b loaded to spare loading section 28a during the spare component pickup process has been released (S170). Since the spare component pickup process is a process for picking up components from positions not scheduled in mounting condition information 24, in mounting device 15, loader 18 is configured to move exchange feeder 17b loaded to spare loading section 28a to the position of the proper loading section as quickly as possible. In S170, CPU 21 determines whether exchange feeder 17b during the spare component pickup process is released from being loaded. When exchange feeder 17b is not released from being loaded during the spare component pickup process, CPU 21 continues the processes from S130 onward, that is, the mounting process including the spare component pickup process, using exchange feeder 17b. On the other hand, when exchange feeder 17b undergoing the spare component pickup process is released in S170, the operation of mounting section 30, particularly the operation of mounting head 32, is suspended (S180), and the processes of S110 and subsequent steps are executed. At this juncture, loader 18 executes a process for releasing exchange feeder 17b, collecting component depleted feeder 17c, and loading the released exchange feeder 17b to the position from which component depleted feeder 17c was collected. Then, when exchange feeder 17b is loaded to the proper loading section, CPU 21 determines in S110 that there is no component depleted feeder 17c, and executes the processes of S190 and subsequent steps. As described above, in mounting device 15, the interruptions of the mounting process is avoided as much as possible by performing the spare component pickup process using exchange feeder 17b loaded to spare loading section 28a.

Figure 5:
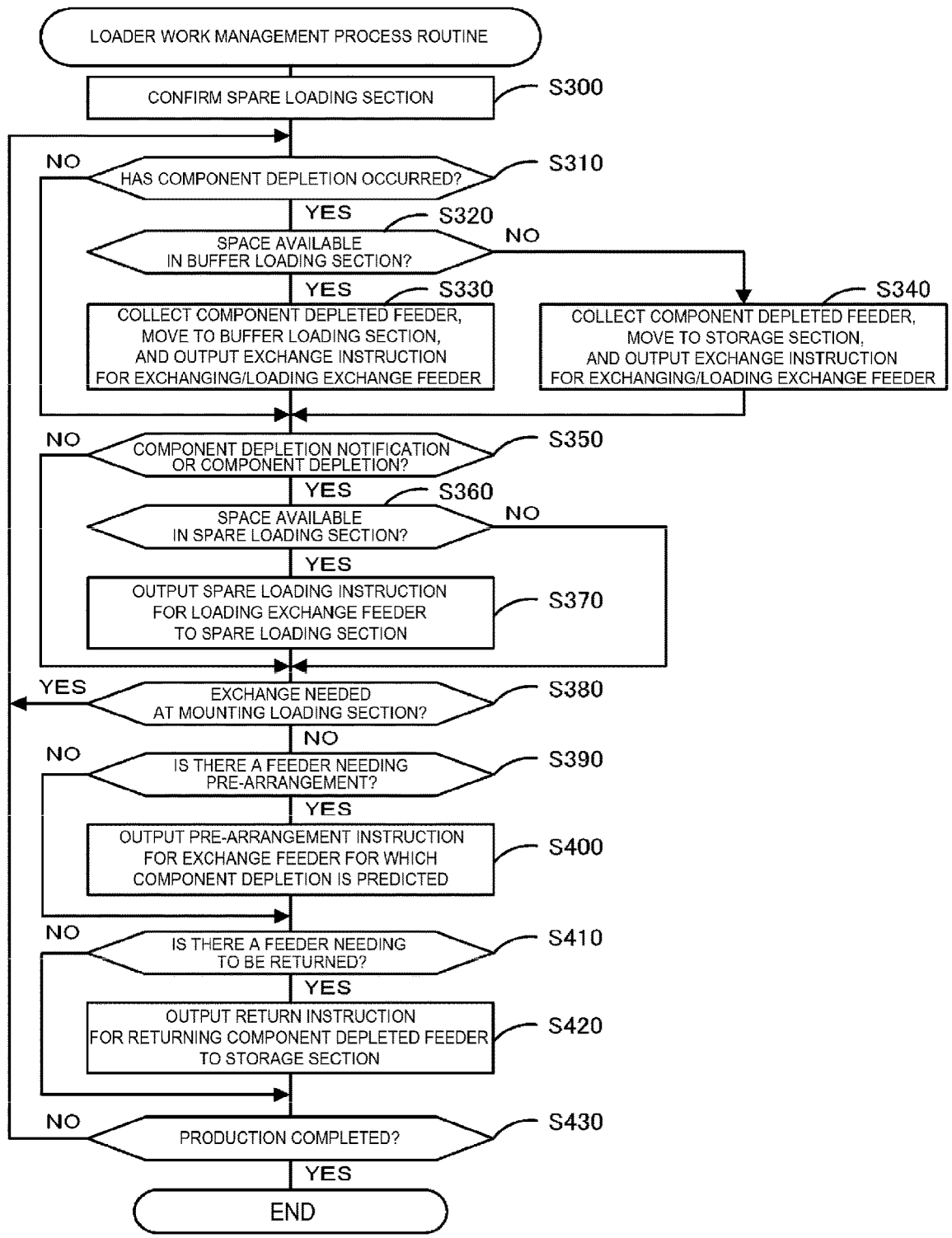
FIG. 5 is a flowchart showing an example of a loader work management process routine.

Next, the process for executing work management of loader 18 performed by management PC 14 will be described. Management PC 14 instructs loader 18 on the content of the work, and loader 18 executes the work according to instructions from management PC 14. FIG. 5 is a flowchart showing an example of a loader work management process routine executed by CPU 41 included in management control section 40 of management PC 14. This routine is stored in storage section 43 of management PC 14 and executed after the booting up of mounting system 10. When this routine is started, CPU 41 first confirms the position of spare loading section 28a based on mounting condition information 44 (S300) and determines whether there is a component depleted feeder 17c in which component depletion has occurred based on information acquired from mounting device 15 (S310). If there is no component depleted feeder 17c, CPU 41 determines whether there is notification feeder 17a for which a component depletion notification has been made (S350). If there is no notification feeder 17a, CPU 41 determines whether there is feeder 17 that needs to be exchanged by mounting loading section 28 (S380). Feeder 17 that needs to be exchanged in mounting loading section 28 corresponds to, for example, exchange feeder 17b during the spare component pickup process, component depleted feeder 17c loaded to mounting loading section 28, and the like. S380 is a determination for preferentially processing feeder 17 that needs to be exchanged in mounting loading section 28.

If there is no feeder 17 that needs to be exchanged in mounting loading section 28, CPU 41 determines whether there is a feeder that needs to be pre-arranged (S390). The pre-arrangement is a process of predicting in which feeders 17 component depletion is likely to occur later sufficiently before the occurrence of the component depletion and the advance notification of component depletion, and placing exchange feeder 17b corresponding to predicted feeder 17 in advance in the vicinity of the predicted feeder 17 (e.g., buffer loading section 29). The prediction of the feeder in which component depletion will occur can be performed, for example, by calculating the time until the predetermined predicted number of components is reached based on the number of consumed components per unit time and the current number of remaining components. When there is feeder 17 that needs to be pre-arranged, CPU 21 creates a pre-arrangement instruction to move exchange feeder 17b of feeder 17 in which component depletion is predicted to buffer loading section 29 that is in the vicinity of feeder storage section 13 and outputs the instruction to loader 18 (S400). CPU 41 places priority on the module to which feeder 17, which is to be a pre-arrangement target, is loaded and sets the position of the loading section to be pre-arranged. The pre-arrangement instruction includes the position of exchange feeder 17b to be received and the position of the loading section to be pre-arranged. Loader 18 that has acquired the pre-arrangement instruction receives exchange feeder 17b at the designated receiving destination and causes exchange feeder 17b to load to the designated loading destination (e.g., an available slot of buffer loading section 29). After S400 or when there is no feeder needing pre-arrangement in S390, CPU 41 determines whether the component depleted feeder 17c needing to be returned to feeder storage section 13 is in buffer loading section 29 (S410). When there is a component depleted feeder 17c that needs to be returned, CPU 41 creates a return instruction for receiving the component depleted feeder 17c, returns the component depleted feeder 17c to feeder storage section 13, and outputs the return instruction to loader 18 (S420). The return instruction includes the position of the loading section of the component depleted feeder 17c to be received and the position of feeder storage section 13 to be returned. Loader 18 that has acquired the return instruction receives component depleted feeder 17c in buffer loading section 29, which is the designated receiving destination, and moves component depleted feeder 17c to the designated return destination. After S420 or when there is no feeder 17 that needs to be returned in S410, CPU 41 determines whether production of board S is completed (S430), and if production of board S is not completed, the processes of S300 and subsequent steps are executed, but if the production of board S is completed in S430, CPU 41 terminates this routine.

On the other hand, when the mounting process is continued and it is determined that there is notification feeder 17a for which a component depletion notification has been made in S350, CPU 41 determines whether there is space available in spare loading section 28a (S360), and when there is space available in spare loading section 28a, CPU 41 creates a spare loading instruction to receive exchange feeder 17b corresponding to spare loading section 17a, load exchange feeder 17b to spare loading section 28a, and output the instruction to loader 18 (S370). The spare loading instruction includes the position of exchange feeder 17b to be received and the position of spare loading section 28a where exchange feeder 17b is to be loaded. Based on arrangement state information 45, CPU 41 sets buffer loading section 29, feeder storage section 13, and the like that are arranged in advance as receivers of exchange feeder 17b. It should be noted that when there is no space in spare loading section 28a, CPU 41 may store the information of notification feeder 17a in storage section 43, and thereafter, may make an affirmative determination in S350. Then, after S370 or when there is no space in spare loading section 28a in S360, CPU 41 executes the process of S380 and subsequent steps.

When the mounting process is further continued and it is determined in S310 that there is a component depleted feeder 17c in which component depletion has occurred, CPU 41 determines whether there is space available in buffer loading section 29 (S320) and when there is space available in buffer loading section 29, CPU 41 causes component depleted feeder 17c to be collected, moved to buffer loading section 29, and loaded to buffer loading section 29, and CPU 41 creates an exchange instruction to load exchange feeder 17b to component depletion loading section 28c to which component depleted feeder 17c had been loaded, and outputs the exchange instruction to loader 18 (S330). The exchange instruction includes the position of component depleted feeder 17c to be collected and the position of exchange feeder 17b to be loaded thereto. When there is a component depleted feeder 17c, mounting device 15 executes the spare component pickup process using exchange feeder 17b loaded to spare loading section 28a. Accordingly, CPU 41 sets spare loading section 28a as the receiver of exchange feeder 17b. On the other hand, when there is no space in buffer loading section 29, CPU 41 collects the corresponding component depleted feeder 17c, loads exchange feeder 17b to component depletion loading section 28c to which component depleted feeder 17c is loaded, creates an exchange instruction command to move the collected component depleted feeder 17c to feeder storage section 13, and outputs the exchange instruction to loader 18 (S340). It should be noted that when a large number of component depleted feeders 17c occur simultaneously in mounting section 28, CPU 41 stores information of component depleted feeders 17c in storage section 43, makes an affirmative decision in S310, and issues exchange instructions in sequence. After S330 or S340, CPU 41 executes the process of S350 and subsequent steps. As described above, management PC 14 exchanges feeder 17 and continues the mounting process.

Figure 6:
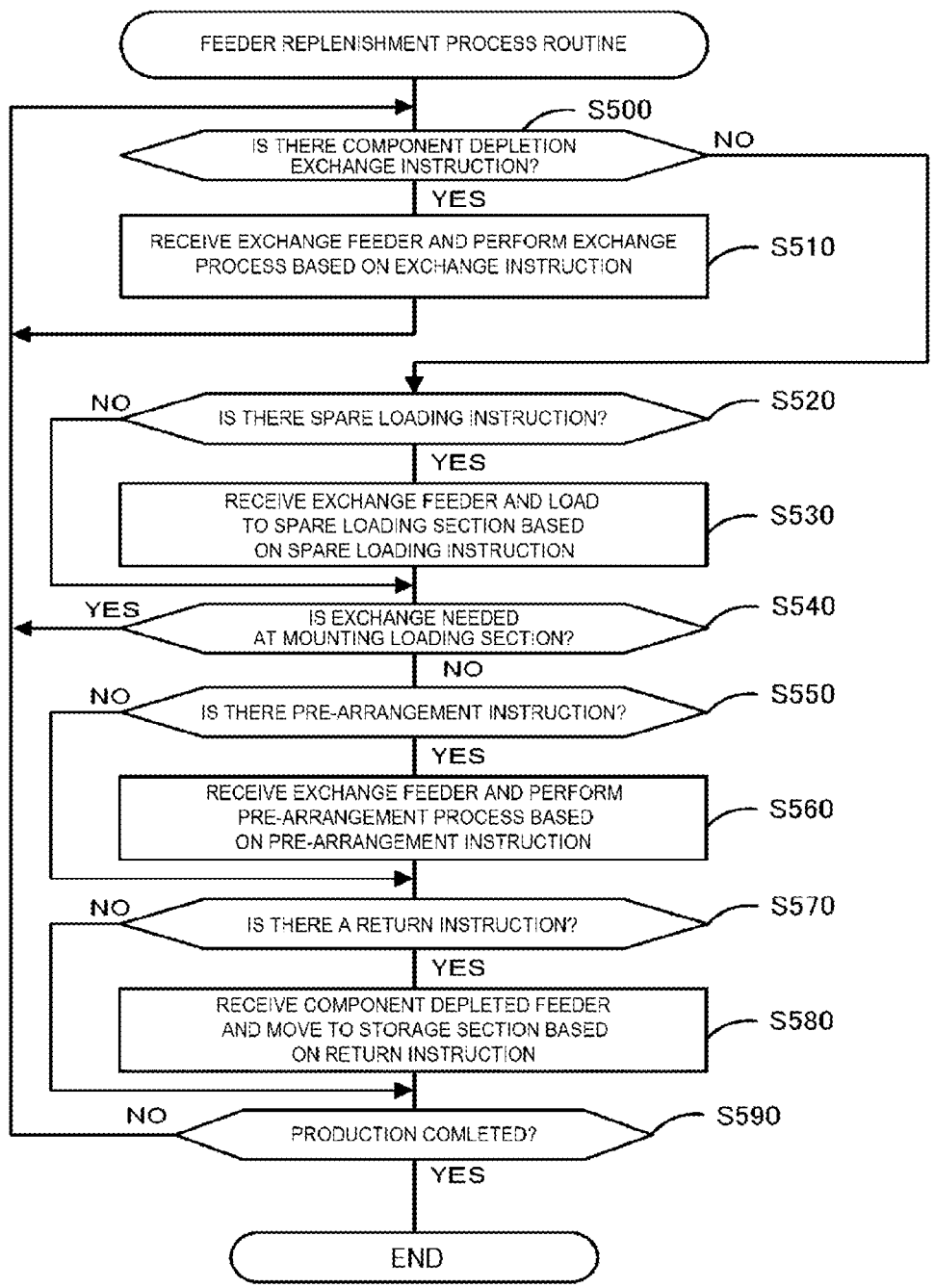
FIG. 6 is a flowchart showing an example of a feeder replenishment process routine.

Next, a feeder replenishment process executed by loader 18 that has acquired various instructions will be described. FIG. 6 is a flowchart showing an example of a feeder replenishment process routine executed by CPU 51 included in moving control section 50 of loader 18. This routine is stored in storage section 53 of loader 18 and repeatedly executed after the booting up of loader 18. When this routine is started, CPU 51 first determines whether there is an exchange instruction based on component depletion (S500), and when there is an exchange instruction, CPU 51 executes the exchange process for receiving exchange feeder 17b and exchanging exchange feeder 17b with component depleted feeder 17c based on the above-described exchange instruction (S510), and then CPU 51 executes the processes of S500 and subsequent steps. Loader 18 preferentially processes the exchange instruction. On the other hand, when there is no exchange instruction in S500, CPU 51 determines whether there is a spare loading instruction (S520), and when there is a spare loading instruction, CPU 51 executes a process for receiving exchange feeder 17b and loading exchange feeder 17b to spare loading section 28a based on the spare loading instruction described above (S530).

After S530 or when there is no spare loading instruction in S520, CPU 51 determines whether there is feeder 17 that needs to be exchanged in mounting loading section 28 (S540). Similar to S380 described above, S540 is a determination for preferentially process feeder 17 that needs to be exchanged in mounting loading section 28. When there is feeder 17 that needs to be exchanged in mounting loading section 28, CPU 51 executes the processes of S500 and subsequent steps. On the other hand, when there is no feeder 17 that needs to be exchanged in mounting loading section 28, CPU 51 determines whether there is a pre-arrangement instruction (S550). If there is a pre-arrangement instruction, CPU 51 executes a pre-arrangement process for receiving exchange feeder 17b and causing buffer loading section 29 to load exchange feeder 17b based on the pre-arrangement instruction described above (S560).

After S560 or when there is no pre-arrangement instruction in S550, CPU 51 determines whether there is a return instruction (S570). When there is a return instruction, CPU 51 executes a return process for receiving component depleted feeder 17c from buffer loading section 29 based on the above-described return instruction and returning component depleted feeder 17c to feeder storage section 13 (S580). On the other hand, after S580 or when there is no return instruction in S570, CPU 51 determines whether production of board S is completed (S590), and when production of board S is not completed, executes the processes of S500 and subsequent steps, whereas when the production of board S is completed in S590, CPU 51 terminates this routine.

FIG. 7 is a diagram showing an example of feeder 17 being moved, in which FIG. 7A is a diagram in which exchange feeder 17b is loaded to spare loading section 28a, FIG. 7B is a diagram in which component depleted feeder 17c is collected and exchange feeder 17b is moved, FIG. 7C is a diagram in which exchange feeder 17b is loaded to component depletion loading section 28c, and FIG. 7D is a diagram in which component depleted feeder 17c is moved to buffer loading section 29. In FIG. 7, a case where #1 and #2 of mounting loading section 28 are spare loading sections 28a, #4 is notification loading section 28b and component depletion loading section 28c, and #8 is available loading section 28d will be described. Loader 18 executes the pre-arrangement process when there is ample work time and moves exchange feeder 17b to buffer loading section 29. As a result, loader 18 can receive exchange feeder 17b with a short moving distance (FIG. 7A). Next, when there is a notification feeder 17a for which a component depletion notification has been made, loader 18 causes exchange feeder 17b corresponding to notification feeder 17a to load to spare loading section 28a (FIG. 7A). Next, when there is a component depleted feeder 17c in which component depletion has occurred, loader 18 executes a process for exchanging component depleted feeder 17c with the corresponding exchange feeder 17b (FIG. 7B). Loader 18 may not be able to respond immediately even if there is a component depleted feeder 17c, for example, while moving or during other operations. In this case, mounting device 15 executes the spare component pickup process using exchange feeder 17b loaded to spare loading section 28a and continues the mounting process. Further, when component depleted feeder 17c is released from being loaded, with exchange feeder 17b to be loaded to the proper position, mounting device 15 suspends the mounting process. Subsequently, loader 18 causes exchange feeder 17b to be loaded to component depletion loading section 28c that is in the proper position (FIG. 7C). Mounting device 15 then executes a mounting process for picking up components from exchange feeder 17. Loader 18 then temporarily retracts the collected component depleted feeder 17c to available buffer loading section 29 (FIG. 7D). Thereafter, loader 18 executes a return process for moving component depleted feeder 17c from buffer loading section 29 to feeder storage section 13 when there is enough work time. As described above, loader 18 efficiently exchanges feeder 17 with a shorter moving distance in a situation where there is not much time due to component depletion.

Here, the correspondence between configuration elements of the present embodiment and configuration elements of the present disclosure will be specified. Mounting device 15 of the present embodiment corresponds to a mounting device, and loader 18 corresponds to a moving work device. Further, supply section 27 corresponds to a supply section, mounting loading section 28 and buffer loading section 29 correspond to loading sections, mounting section 30 corresponds to a mounting section, mounting control section 20 corresponds to a mounting control section, accommodation section 54 corresponds to an accommodation section, moving control section 50 corresponds to a moving control section, and feeder storage section 13 corresponds to a storage section. In addition, the tape corresponds to a holding member, and board S corresponds to a mounting target.

In mounting system 10 described above, mounting device 15 causes the mounting section 30 to pick up components from feeder 17 at the position designated by mounting condition information 24. Next, exchange feeder 17b, among feeders 17 loaded to loading sections, holding the component expected to be depleted, is moved, and exchange feeder 17b is loaded to spare loading section 28a from which the component can be picked up by mounting section 30. Subsequently, when component depletion of feeder 17 for which component depletion is predicted occurs, mounting device 15 executes a spare component pickup process that causes mounting section 30 to pick up components from exchange feeder 17b loaded to spare loading section 28a at a position not designated in mounting condition information 24. Then, when component depletion of feeder 17 for which component depletion is predicted occurs, loader 18 collects component depleted feeder 17c in accommodation section 54 while moving exchange feeder 17b for which the spare component pickup process corresponding to the collected component depleted feeder 17c has been performed, and loading exchange feeder 17b to the loading section from which the collection was performed. In mounting system 10, when component depletion is predicted, exchange feeder 17b is loaded to spare loading section 28a, the mounting process is continued by the spare component pickup process, whereas when the component depletion occurs, exchange feeder 17b performing the spare component pickup process is moved to the proper position. In mounting system 10, by moving exchange feeder 17b to the proper position, it is possible to shorten the time period for the spare component pickup process as much as possible. In addition, even in a case where component depletion occurs in another feeder 17 when loader 18 exchanges exchange feeder 17b, it is possible to prevent stopping of the mounting process by executing the spare component pickup process. In addition, by repeating such processes, as a result, it is possible to suppress stopping of the mounting process caused by frequent occurrences of component depleted feeders 17c. As described above, mounting system 10 can efficiently execute the mounting process.

In addition, since mounting system 10 secures one or more spare loading sections 28a to which exchange feeder 17b can be loaded, it is possible to execute the spare component collection process as reliably as possible. In addition, moving control section 50 receives exchange feeder 17b from either buffer loading section 29 or feeder storage section 13. Since loader 18 receives exchange feeder 17b in mounting system 10, the moving time can be reduced. Furthermore, moving control section 50 causes component depleted feeder 17c collected in accommodation section 54 to load to buffer loading section 29 and then causes component depleted feeder 17c loaded to buffer loading section 29 to move to feeder storage section 13. In mounting system 10, after feeder 17 is exchanged in supply section 27, for example, it is possible to execute the mounting process more efficiently because used feeder 17 is moved to feeder storage section 13 when space is available during the operating time of loader 18. In addition, since the operation of exchanging component depleted feeder 17c with exchange feeder 17b is prioritized over other operations (e.g., the returning operation or the pre-arrangement operation), moving control section 50 can further suppress stopping of the mounting process by eliminating component depletions which cause stopping of the mounting process. Further, when component depleted feeder 17c is collected by loader 18 during the sample component pickup process, mounting control section 20 stops mounting section 30 from picking up components from exchange feeder 17b and then causes mounting section 30 to pick up components from feeder 17 at the position designated in mounting condition information 24. When component depleted feeder 17c is collected, mounting system 10 predicts the position switching of exchange feeder 17b and stops mounting section 30 from picking up components from exchange feeder 17b. Thereafter, when exchange feeder 17b is loaded to the loading section from which component depleted feeder 17c was collected, mounting section 30 is caused to pick up components from loaded feeder 17. In this manner, with the collection of component depleted feeder 17c as a trigger, the positional switching of exchange feeder 17b can be smoothly executed.

It is obvious that the present disclosure is not limited to the above-described embodiments and can be implemented in various modes as long as the modes belong to the technical scope of the present disclosure.

For example, in the above embodiment, spare loading section 28a is secured in advance, but the present disclosure is not particularly limited thereto, and available loading section 28d may be a spare loading section.

In the above embodiment, although the notification of component depletion is made in S350 and exchange feeder 17b is loaded to spare loading section 28a when there is space in spare loading section 28a in S360, the present disclosure is not particularly limited thereto. For example, even when there is no advance notice of component depletion, loader 18 may load exchange feeder 17b corresponding to feeder 17 that will be component depleted next to spare loading section 28a provided there is a space in spare loading section 28a. Even in this manner, it is possible to execute the spare component pickup process.

In the above embodiment, supply section 27 includes one or more modules gathered for each of the loading sections, but is not particularly limited thereto, and may not include a module.

Although the above embodiment has been described as having supply section 27 only on the front side of mounting device 15, supply section 27 may also be provided on the rear side of mounting device 15. Mounting system 10 may secure spare loading section 28a also in rear supply section 27. The rear supply section 27 may have mounting loading section 28 and buffer loading section 29.

In the above embodiment, the processes of S150, S160, S210, and S220 for predicting component depletion or determining the occurrence of component depletion are described as being performed by mounting device 15, but the present disclosure is not particularly limited to this, and the processes may be performed by another device, for example, management PC 14 or host PC 19. Management PC 14 may obtain the determination result from the device that has performed the determination process or may obtain the determination result by performing the determination process in management control section 40 after obtaining the number of remaining components.

In the above embodiment, mounting system 10 includes printing device 11, print inspection device 12, feeder storage 13, management PC 14, and mounting device 15, but the present disclosure is not particularly limited thereto, and one or more of the above devices may be omitted or other devices may be added.

In the above embodiment, management PC 14 installed in feeder storage section 13 has been described as managing loader 18, but the present disclosure is not particularly limited to this and may be provided with this function in other devices such as host PC 19, mounting device 15, and loader 18, for example. In the above embodiment, loader 18 is configured to load or collect feeder 17, but the present disclosure is not particularly limited thereto, and may be configured so that automatic conveyance vehicle 16 loads and collects feeder 17.

In the above embodiment, the present disclosure was described by applying it to mounting system 10, mounting device 15, and loader 18, but the present disclosure may be applied to host PC 19 or to the moving work management method.

Here, the mounting system including the mounting-related device of the present disclosure may be configured as follows. For example, the mounting system of the present disclosure may secure one or more spare loading sections to which exchange feeder can be loaded. In this mounting system, it is possible to execute the spare component pickup process as reliably as possible. Here, the mounting system may empirically determine the number of spare loading sections as a number at which the efficiency of the mounting process is not reduced.

In the mounting system of the present disclosure, when space becomes available in the spare loading section, the moving control section may move an exchange feeder holding components for which component depletion is predicted next and load the exchange feeder to the spare loading section. In this mounting system, it is possible to continue the execution of the spare component pickup process.

In the mounting system of the present disclosure, the supply section may have a mounting loading section from which the mounting section can pick up the component and a buffer loading section from which the mounting section cannot pick up the component; the mounting system may have a storage section, different from the buffer loading section, configured to store the feeder; and the moving control section may receive the exchange feeder from any one of the buffer loading section and the storage section. Since the moving work device receives the exchange feeder within the mounting system, the moving time is reduced. In this mounting system, the moving control section may load the component depleted feeder collected in the accommodation section to the buffer loading section and then move the component depleted feeder loaded to the buffer loading section to the storage section. In this mounting system, after the feeder is exchanged in the supply section, for example, it is possible to execute the mounting process more efficiently because the used feeder is moved to the feeder storage section when there is time for the moving work device.

In the mounting system of the present disclosure, the moving control section may prioritize the operation of exchanging the component depleted feeder with the exchange feeder over other operations. In this mounting system, it is possible to further suppress stopping of the mounting process.

In the mounting system of the present disclosure, when the component depleted feeder is collected by the moving work device during the spare component pickup process, the mounting control section may stop the mounting section from picking up the component from the exchange feeder and then cause mounting section to pick up the component from the feeder at the position designated in the mounting condition information. When the component depleted feeder is collected, the mounting system predicts the position switching of the exchange feeder and stops the mounting section from picking up components from the exchange feeder. Thereafter, when the exchange feeder is loaded to the loading section from which the component depleted feeder is collected, the mounting section is caused to pick up components from the loaded feeder. In this manner, with the collection of the component depleted feeder as a trigger, the positional switching of the exchange feeder is smoothly executed.

The moving work device of the present disclosure is configured to move a feeder to be collected from a supply section and/or loaded to the supply section, and is used in a mounting system including: a mounting device provided with a supply section configured to load a feeder, including a holding member for holding components, to one or more loading sections, a mounting section configured to mount the component supplied from the supply section to a mounting target, and a mounting control section configured to execute a spare component pickup process in which the mounting section is caused to pick up the component from a feeder at a position designated in mounting condition information but is caused to pick up the component from an exchange feeder loaded to a spare loading section from which the mounting section can pick up the component when component depletion of the feeder occurs; wherein the moving work device comprises: an accommodation section configured to accommodate the feeder, and a moving control section configured, when component depletion is predicted for the feeder loaded to the loading section, to move and load the exchange feeder, holding the component for which component depletion is predicted, to the spare loading section, collect the component depleted feeder in the accommodation section when component depletion occurs for the feeder in which component depletion is predicted, and move and load the exchange feeder, on which the spare component pickup process corresponding to the collected component depleted feeder is being performed, to the loading section from which the component depleted feeder was collected.

In this moving work device, similarly to the mounting system described above, by moving the exchange feeder to the proper position, it is possible to shorten the time period for the spare component pickup process as much as possible. In addition, even in a case where component depletion occurs in another feeder when the moving work device is exchanging the exchange feeder, it is possible to prevent stopping of the mounting process by executing the spare component pickup process. In addition, by repeating such processes, as a result, it is possible to suppress stopping of the mounting process caused by frequent occurrences of component depleted feeders. As described above, in this mounting system, it is possible to efficiently execute the mounting process.

In the moving work device of the present disclosure, when space becomes available in the spare loading section, the moving control section may move an exchange feeder holding components for which component depletion is predicted next and load the exchange feeder to the spare loading section. In this moving work device, it is possible to continue the execution of the spare component pickup process.

In the moving work device of the present disclosure, the supply section may have a mounting loading section from which the mounting section can pick up the component and a buffer loading section from which the mounting section cannot pick up the component; the mounting system may have a storage section, different from the buffer loading section, configured to store the feeder; and the moving control section may receive the exchange feeder from any one of the buffer loading section and the storage section. Since the moving work device receives the exchange feeder within the mounting system, the moving time is reduced. In the moving work device, the moving control section may load the component depleted feeder collected in the accommodation section to the buffer loading section and then move the component depleted feeder loaded to the buffer loading section to the storage section. In this moving work device, after the feeder is exchanged in the supply section, for example, it is possible to execute the mounting process more efficiently because the used feeder is moved to the feeder storage section when there is time for the moving work device.

In the moving work device of the present disclosure, the moving control section may prioritize the operation of exchanging the component depleted feeder with the exchange feeder over other operations. In this mobile work device, it is possible to further suppress stopping of the mounting process.

The moving work management method of the present disclosure comprises: a mounting device provided with a supply section configured to load a feeder, including a holding member for holding components, to one or more loading sections, a mounting section configured to mount the component supplied from the supply section to a mounting target, and a mounting control section configured to execute a spare component pickup process in which the mounting section is caused to pick up the component from a feeder at a position designated in mounting condition information but is caused to pick up the component from an exchange feeder loaded to a spare loading section from which the mounting section can pick up the component when component depletion of the feeder occurs; and a moving work device provided with an accommodation section configured to accommodate the feeder and a moving control section configured to move the feeder to be collected from the supply section and/or be loaded to the supply section; wherein the moving work management method comprises: (a) a step in which, when component depletion is predicted for the feeder loaded to the loading section, the moving work device is caused to move and load the exchange feeder, holding the component for which component depletion is predicted, to the spare loading section, and (b) a step in which, the moving work device is caused to collect the component depleted feeder when component depletion occurs for the feeder for which component depletion is predicted but is caused to move and load the exchange feeder, corresponding to the collected component depleted feeder, on which the spare component pickup process is being performed.

In this moving work management method, similarly to the mounting system described above, by moving the exchange feeder to the proper position, it is possible to shorten the time period for the spare component pickup process as much as possible. In addition, even in a case where component depletion occurs in another feeder when the moving work device is exchanging the exchange feeder, it is possible to prevent stopping of the mounting process by executing the spare component pickup process. In addition, by repeating such processes, as a result, it is possible to suppress stopping of the mounting process caused by frequent occurrences of component depleted feeders. As described above, in this mounting system, it is possible to efficiently execute the mounting process. In the moving work management method, various modes of the mounting system and the moving work device described above may be employed or steps for achieving each function of the mounting system and the moving work device described above may be added.

INDUSTRIAL APPLICABILITY

The present disclosure is applicable to the technological field of devices for picking up and mounting components.

REFERENCE SIGNS LIST

10 Mounting system, 11 Printing device, 12 Print inspection device, 13 Feeder storage section, 14 Management PC, 15 Mounting device, 16 Automatic conveyance vehicle, 17 Feeder, 17a Advance notification feeder, 17b Exchange feeder, 17c Component depleted feeder, 18 Loader, 18a X-axis rail, 19 Host PC, 20 Mounting control section, 21 CPU, 23 Storage section, 24 Mounting condition information, 25 Arrangement state information, 26 Board processing section, 27 Supply section, 28 Mounting loading section, 28a Spare loading section, 28b Notification loading section, 28c Component depletion loading section, 28d Available loading section, 29 Buffer loading section, 30 Mounting section, 31 Head moving section, 32 Mounting head, 33 Nozzle, 35 Communication section, 38 Slot, 39 Connecting section, 40 Management control section, 41 CPU, 43 Storage section, 44 Mounting condition information, 45 Arrangement state information, 47 Communication section, 48 Display section, 49 Input device, 50 Moving control section, 51 CPU, 53 Storage section, 54 Accommodation section, 55 Exchange section, 56 Moving member, 57 Communication section, S Board.

The invention claimed is:

1. A mounting system comprising:
a mounting device provided with a supply section configured to load a feeder, including a holding member for holding components, to one or more loading sections, a mounting section configured to mount the components supplied from the supply section, and a mounting control section configured to control the mounting section; and
a moving work device provided with an accommodation section configured to accommodate feeders, and a moving control section configured to move the feeders to collect the feeders from the supply section and/or load the feeders to the supply section; wherein
the mounting control section causes the mounting section to pick up the component from a feeder at a position designated in mounting condition information;
the moving control section, when component depletion of the feeder loaded to the loading section is predicted, moves an exchange feeder holding the component for which the component depletion is predicted and loads the exchange feeder to a spare loading section from which components can be picked up by the mounting section;
the mounting control section executes a spare component pickup process for causing the mounting section to pick up the component from the exchange feeder loaded to the spare loading section at a position not designated in mounting condition information when component depletion occurs for the feeder for which component depletion is predicted; and
the moving control section collects the component depleted feeder in the accommodation section when component depletion occurs for the feeder in which component depletion is predicted, and moves and loads the exchange feeder, on which the spare component pickup process corresponding to the collected component depleted feeder is being performed, to the loading section from which the component depleted feeder was collected.

2. The mounting system of claim 1, wherein the mounting system secures one or more spare loading sections to which the exchange feeder can be loaded.

3. The mounting system of claim 1, wherein, when space becomes available in the spare loading section, the moving control section moves an exchange feeder holding components for which component depletion is predicted next and loads the exchange feeder to the spare loading section.

4. The mounting system of claim 1, wherein
the supply section has a mounting loading section from which the mounting section can pick up the component and a buffer loading section from which the mounting section cannot pick up the component;
the mounting system has a storage section, different from the buffer loading section, configured to store the feeder; and
the moving control section receives the exchange feeder from any one of the buffer loading section and the storage section.

5. The mounting system of claim 4, wherein the moving control section loads the component depleted feeder collected in the accommodation section to the buffer loading section and then moves the component depleted feeder loaded to the buffer loading section to the storage section.

6. The mounting system of claim 1, wherein the moving control section prioritizes an operation of exchanging the component depleted feeder with the exchange feeder over other operations.

7. The mounting system of claim 1, wherein, when the component depleted feeder is collected by the moving work device during the spare component pickup process, the mounting control section stops the mounting section from picking up the component from the exchange feeder and then causes mounting section to pick up the component from the feeder at the position designated in the mounting condition information.

8. A moving work device, configured to move a feeder to be collected from a supply section and/or loaded to the supply section, used in a mounting system comprising:
a mounting device provided with a supply section configured to load a feeder, including a holding member for holding components, to one or more loading sections, a mounting section configured to mount the component supplied from the supply section to a mounting target, and a mounting control section configured to execute a spare component pickup process in which the mounting section is caused to pick up the component from a feeder at a position designated in mounting condition information but is caused to pick up the component from an exchange feeder loaded to a spare loading section from which the mounting section can pick up the component when component depletion of the feeder occurs;
wherein the moving work device comprises:
an accommodation section configured to accommodate the feeder, and
a moving control section configured, when component depletion is predicted for the feeder loaded to the loading section, to move and load the exchange feeder, holding the component for which component depletion is predicted, to the spare loading section, collect the component depleted feeder in the accommodation section when component depletion occurs for the feeder in which component depletion is predicted, and move and load the exchange feeder, on which the spare component pickup process corresponding to the collected component depleted feeder is being performed, to the loading section from which the component depleted feeder was collected.

9. The moving work device of claim 8, wherein, when space becomes available in the spare loading section, the moving control section moves an exchange feeder holding a component for which component depletion is predicted next and loads the exchange feeder to the spare loading section.

10. The moving work device of claim 8, wherein
the supply section has a mounting loading section from which the mounting section can pick up the component and a buffer loading section from which the mounting section cannot pick up the component;

the mounting system has a storage section, different from the buffer loading section, configured to store the feeder; and the moving control section receives the exchange feeder from any one of the buffer loading section and the storage section.

11. The moving work device of claim 10, wherein the moving control section loads the component depleted feeder collected in the accommodation section to the buffer loading section and then moves the component depleted feeder loaded to the buffer loading section to the storage section.

12. The moving work device of claim 8, wherein the moving control section prioritizes the operation of exchanging the component depleted feeder with the exchange feeder over other operations.

13. A moving work management method used in a mounting system comprising:

a mounting device provided with a supply section configured to load a feeder, including a holding member for holding components, to one or more loading sections, a mounting section configured to mount the component supplied from the supply section to a mounting target, and a mounting control section configured to execute a spare component pickup process in which the mounting section is caused to pick up the component from a feeder at a position designated in mounting condition information but is caused to pick up the component from an exchange feeder loaded to a spare loading section from which the mounting section can pick up the component when component depletion of the feeder occurs; and a moving work device provided with an accommodation section configured to accommodate the feeder and a moving control section configured to move the feeder to be collected from the supply section and/or be loaded to the supply section;

wherein the moving work management method comprises:

(a) a step in which, when component depletion is predicted for the feeder loaded to the loading section, the moving work device is caused to move and load the exchange feeder, holding the component for which component depletion is predicted, to the spare loading section, and (b) a step in which, the moving work device is caused to collect the component depleted feeder when component depletion occurs for the feeder for which component depletion is predicted but is caused to move and load the exchange feeder, corresponding to the collected component depleted feeder, on which the spare component pickup process is being performed.

* * * * *